United States Patent [19]
McMullen et al.

[11] 4,203,387
[45] May 20, 1980

[54] CAGE FOR LOW PRESSURE SILICON DIOXIDE DEPOSITION REACTORS

[75] Inventors: James McMullen, San Jose; James Vokac, Oakland, both of Calif.

[73] Assignee: General Signal Corporation, Stamford, Conn.

[21] Appl. No.: 973,736

[22] Filed: Dec. 28, 1978

[51] Int. Cl.² ............................................. C23C 13/08
[52] U.S. Cl. ................................... 118/715; 118/722; 118/728; 156/611
[58] Field of Search ................. 118/48, 49.1, 49, 49.5, 118/715, 722, 728; 156/611

[56] References Cited
U.S. PATENT DOCUMENTS

| | | | |
|---|---|---|---|
| 3,735,727 | 5/1973 | Sussmann | 118/48 |
| 3,823,685 | 7/1974 | Koepp et al. | 118/49 |
| 3,854,443 | 12/1974 | Baerg | 118/49 |
| 3,900,597 | 8/1975 | Chruma et al. | 118/49.1 |
| 3,964,430 | 6/1976 | Purmal | 118/49 |

*Primary Examiner*—Jack P. Brammer
*Attorney, Agent, or Firm*—Blakely, Sokoloff, Taylor & Zafman

[57] ABSTRACT

A cage for low pressure chemical depositions reactors to provide for the relatively uniform deposition of silicon dioxide and phosphorus doped polysilicon along the length of a reactor by the chemical decomposition of silane. The cage is comprised of an open structure, generally surrounding semiconductor wafers supported on boats within the reactor, so as to discourage preferential deposition rates adjacent the silane inlet region of the reactor, and to encourage a more uniform distribution of the decomposable gas along the reactor length to effect more uniform deposition rates than previously accomplished. The open structure helps to quickly develop the flow along the reactor so that the flow quickly stabilizes adjacent the inlet end of the reactor and remains substantially uniform thereafter. Longitudinal alignment of the major elements of the cage provides continuous flow surfaces along the length of the reactor.

10 Claims, 4 Drawing Figures

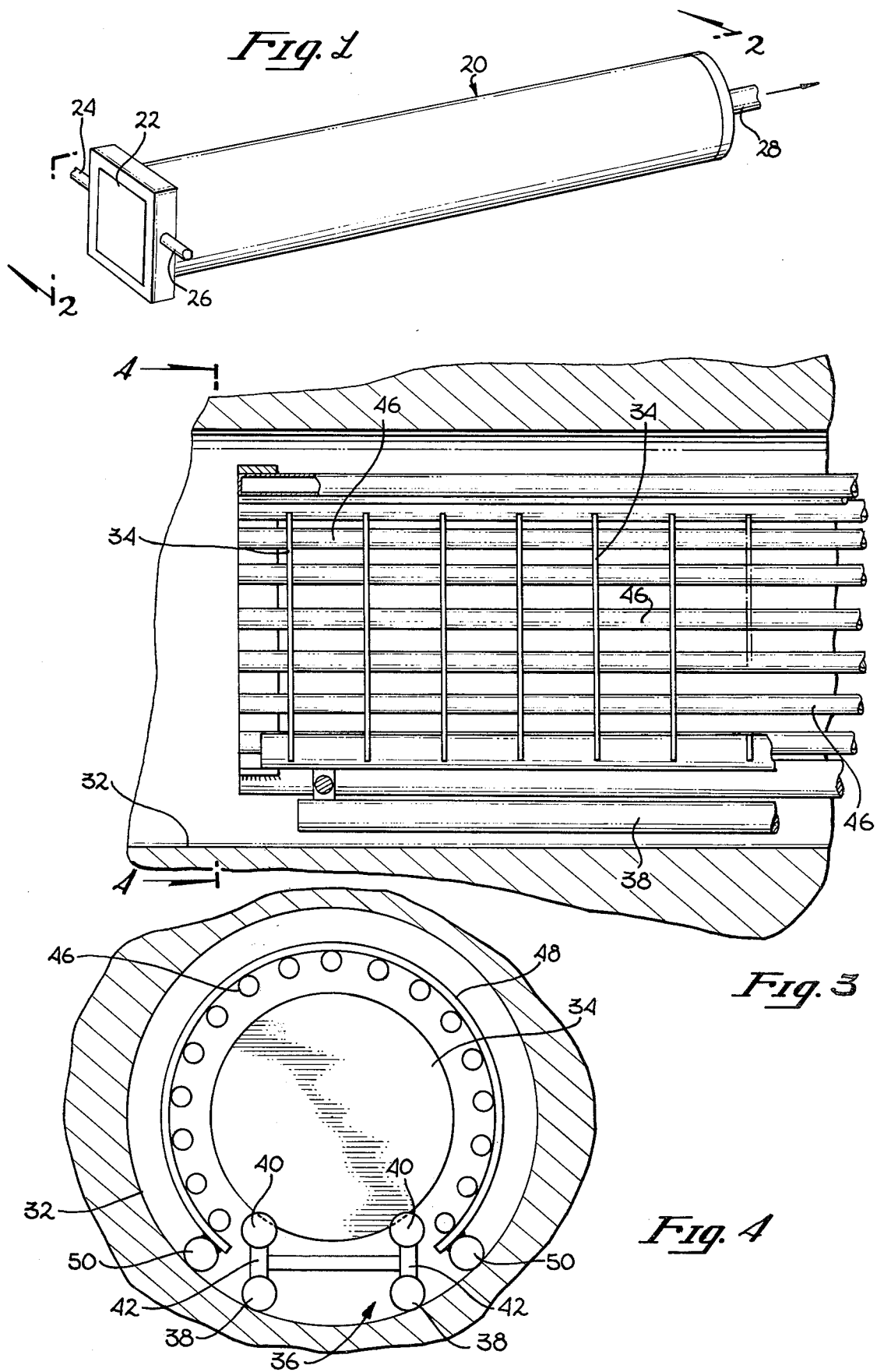

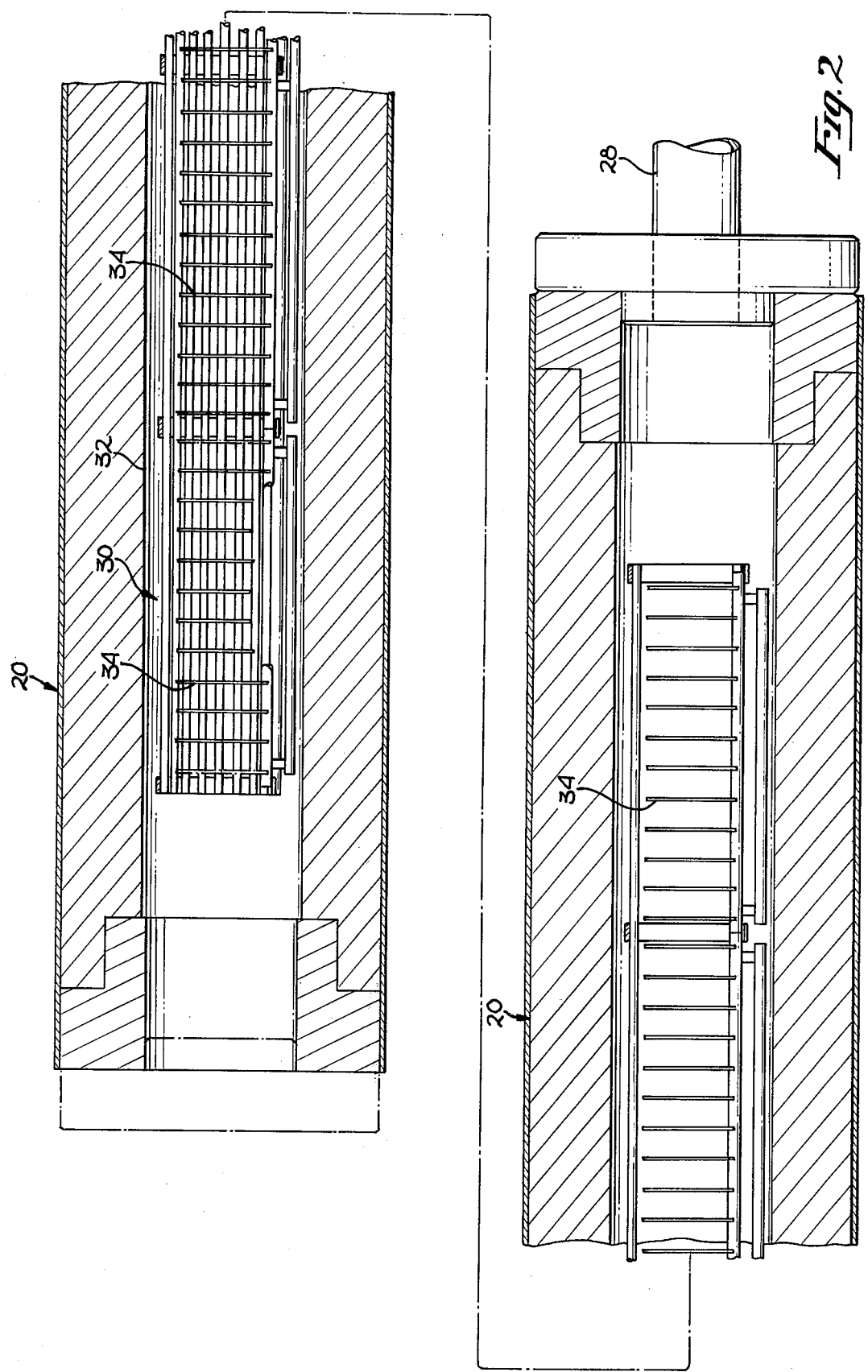

CAGE FOR LOW PRESSURE SILICON DIOXIDE DEPOSITION REACTORS

BACKGROUND OF THE INVENTION

1. Field of the Invention

The present invention relates to the field of deposition processes and more specifically by gaseous deposition processes for semiconductor device fabrication.

2. Prior Art

Modern integrated circuits are fabricated utilizing a plurality of oxidizing, masking, etching, diffusion and deposition processes. Because of the selective operations, particularly etching operations after the masking of the required detailed pattern, the topography of the initially flat wafer-being processed becomes sharply defined in very fine detail by the minute, though clearly defined layers and/or levels developed in or on the semiconductor wafer. In certain instances during processing it may be desired to create a silicon oxide layer for insulation and/or passivation purposes. Where the oxide layer is to be created on the semiconductor surface the semiconductor surface can be oxidized by heating in an oxygen rich environment. However, this requires a substantial temperature and of course a semiconductor surface to be oxidized, whereas in certain instances the exposed semiconductor surface is not present, and the development of the integrated circuit has proceeded to a stage where high temperature exposure is not possible or desirable. In particular, once metalization layers are in place, particularly aluminum metalization layers such as for connecting pads, interconnect lines, metal gates, etc. The maximum tolerable temperature for the semiconductor wafer is quite limited. Further, of course, a silicon oxide layer cannot be grown over the metalization layers for passivation purposes but must be deposited by some suitable process within the allowable temperature exposure capabilities of the wafer at that stage of fabrication.

One process for the deposition of silicon oxide which is known in the prior art is the decomposition of silane (SiH4) in an oxygen rich environment to produce silicon dioxide and water in accordance with the following reaction:

$$SiH_4 + 2O_2 \rightarrow SiO_2 \downarrow + 2H_2O \quad (1)$$

This process as well as equipment for practicing the process is disclosed in U.S. Pat. No. 3,854,443.

For the efficient use of this process on a production basis, it is highly desirable if the process may be practiced in a batch processing scheme, utilizing production ovens and furnaces commonly found in semiconductor manufacturing facilities. Such equipment allows the processing of many wafers at the same time, so that oxidation, diffusion, etc. may be done on a batch basis rather than an individual basis. Such furnaces generally have a cylindrical configuration, with the inner furnace wall being defined by a quartz tube closed at one end and having a door on the other end, within which boats supporting semiconductor wafers can be inserted for the batch processing. However, when attempts are made to utilize such equipment for the deposition of silicon oxide by the decomposition of silane, substantial non-uniformity in the deposition rates are found, both across the area of any individual wafer, and more particularly along the length of the over because of the drop in the concentration of silane and variation in flow patterns along the length of the over from the injection region.

Deposition of silicon oxide by the decomposition of silane has been practiced in the past utilizing relatively low concentrations of silane in a nitrogen environment, at atmospheric pressure. Such a process provides the desired deposition, though has certain characteristics making it desirable to use a higher percentage concentration of silane in a much lower total pressure environment. However, problems regarding the uniformity of deposition rates across the face of an individual wafer and from wafer to wafer along the furnace tube are particularly severe when a low pressure process is attemped.

One prior art apparatus for the low pressure deposition of silicone oxide effectively uses a double-chambered furnace by the placement of a second enclosure within the first furnace enclosure, with the semiconductor wafers to be processed being located in the inner enclosure. The inner enclosure is coupled to a vacuum pump, and is appropriately perforated so that the atmosphere provided in the outer enclosure is effectively injected into the inner enclosure relatively uniformly along the length thereof. Thus, by providing the desired atmosphere in the outer enclosure and pumping on the inner enclosure, a distributed injection may be achieved. Such a system requires two relatively gas tight enclosures instead of only one. Also turbulence and injection shading as well as the directional characteristics of the flow established by the exhaust create certain limitations regarding this equipment.

BRIEF SUMMARY OF THE INVENTION

A cage for low pressure chemical deposition reactors to provide for the relatively uniform deposition of silicon dioxide along the length of a reactor by the chemical decomposition of silane. The cage is comprised of an open structure, generally surrounding semiconductor wafers supported on boats within the reactor, so as to discourage preferential deposition rates adjacent the silane inlet region of the reactor, and to encourage a more uniform distribution of the decomposable gas along the reactor length to effect more uniform deposition rates than previously accomplished. The open structure helps to quickly develop the flow along the reactor so that the flow quickly stabilizes adjacent the inlet end of the reactor and remains substantially uniform thereafter. Longitudinal alignment of the major elements of the cage provides continuous flow surfaces along the length of the reactor.

BRIEF DESCRIPTION OF THE DRAWINGS

FIG. 1 is a perspective view of a typical oven or furnace used in semiconductor wafer processing.

FIG. 2 is a cross-section of the furnace of FIG. 1 showing the present invention cage therein.

FIG. 3 is a portion of the cross-section of FIG. 2 taken on an expanded scale.

FIG. 4 is a cross-section taken through the longitudinal axis of the furnace illustrating the cage and wafer boat therein.

DETAILED DESCRIPTION OF THE INVENTION

First referring to FIG. 1, a perspective view of a typical diffusion furnace may be seen. The diffusion furnace 20 illustrated in FIG. 1 may be any of the generally known diffusion processing furnaces as are characteristically used in semiconductor processing, such as the furnaces sold by the Lindberg Division of General Signal Corporation. Accordingly, specific details of the furnace construction itself will not be given. It is to be noted, however, that when used in conjunction with the present invention cage, a front openable door 22 is provided with a silane (and in some applications PH$_3$) input line 24 and an oxygen input line 26 for injection of the oxygen into the furnace, with a vacuum line 28 being coupled to the other end of the furnace for reducing the pressure of the atmosphere therein and for establishing the low pressure flow along the length of the furnace. These portions of the furnace are shown only schematically in FIG. 1, as the structure of the furnace doors for such furnaces is well known in the prior art, as is the mixing and the injection of gases into an enclosure through a manifold and other injection devices.

Now referring to FIG. 2, a cross section of the furnace 20 of FIG. 1 illustrating the present invention cage 30 therein may be seen. A portion of the cage may also be seen on a larger scale in FIG. 3, with FIG. 4 showing a cross section of the furnace taken along line 4—4 of FIG. 3, illustrating the end view of the cage and of a boat containing wafers therein. The inner wall 32 of the furnace 20 is typically defined by a quartz tube, with the semiconductor wafter 34 being supported approximately concentric therewith on quartz boats generally indicated by the numeral 36. These boats are well known in the prior art, generally being characterized by a pair of longitudinal rods 38 for resting on the inner wall of the furnace tube 32, and a second pair of longitudinal rods 40 supported thereabove by strut members 42. The upper longitudinal rods 40 are slotted so as to receive and hold semiconductor wafers in an approximately vertical disposition. The boat structures are completed by transverse members 44 coupling the two sides of the boat, typically adjacent the lower region thereof.

The preferred form of cage of the present invention illustrated in the drawings is comprised of a relatively large plurality of longitudinal members 46, seventeen being shown in the specific embodiment disclosed. These members are disposed in an arc spaced radially inward from the furnace wall 32 and generally surrounding the wafers 34 supported on the boat. The members 46 are retained in position by a plurality of support members 48 positioned at various stations along the cage structure for this purpose. It will be noted that the number of such support members 48 is relatively small, five such members being used in the preferred embodiment. The structure is completed by additional slightly larger longitudinal members 50 coupled to the lower portion of the arc-like supports 48 and being of a diameter selected to appropriately support and center the cage as desired. The cage shown is fabricated in its entirety of quartz, quartz tubes having their ends sealed being used for longitudinal members 46 and 50, the various members being fused together at their junctions to provide a structurally sound assembly. It should be noted that with the specific configuration of cage illustrated in the drawing having an open lower region thereof, wafer boats of conventional design may be used therewith without disturbing the cages in any manner during the loading and unloading of the furnace.

In order to provide specificity for one particular design and thereby illustrate certain aspects and advantages thereof, the approximate dimensions for one particular design will be given, though it is to be understood that the present invention is not limited to cages of these particular dimensions, proportions or even of the specific structure, since the description to follow will show that the general principles of the invention disclosed herein may be achieved with cages of other configurations and designs.

The specific embodiment disclosed herein is intended for use in a furnace having a furnace tube with an inner diameter of 135 millimeters and a length of 56 inches. For such a furnace a suitable cage length may be approximately 48 inches. Members 46 in this embodiment are 7 millimeters in diameter with 17 such members being utilized, the members being equally spaced about an arc of approximately 270° or slightly more, and on a circle so as to define a clearance diameter therein of approximately 3.6 inches diameter. This allows the processing of wafers on the order of 3¼ inches in diameter, still leaving some space between the outer diameter of the wafers and the longitudinal members 46. For these proportions the longitudinal support members 50 may be approximately 12 millimeter rods, with the arc-like supports being formed of ½ inch long sections of quartz tubing having an inner diameter of 106 millimeters and an outer diameter of 111 millimeters. With these dimensions, as may be seen particularly in FIG. 4, the longitudinal members 46 define an open structure by the spaces therebetween, the spaces being on the order of the diameter of the members 46 themselves. Thus, since the circumference of each member 46 is more than three times its diameter, the combined surface area of the members 46 actually exceeds the surface area that would be presented by a single side of a corresponding cylindrical section. Stated another way, the total circumference of the 17 individual members 46 actually exceed the arc length of the circular arc over which they are distributed in the presently preferred embodiment; however, this is not critical. As flow proceeds along the furnace tubes it will quickly develop because of the viscous effects to fully occupy the flow space available, being stable thereafter so as to have uniform flow characteristics over substantially the entire length of the furnace tube. Obviously the inner wall of the furnace tube itself aids in this development, and for that reason it is preferable to have the cage members spaced significantly inward from the furnace tube wall, though not immediately on the circumference of the wafers disposed therein so as to not shade the adjacent region of the wafers by radial flow through the open structure of the cage into the region of the wafer, i.e. to allow any wake created by the structure to dissipate, eliminating regions of relatively high velocity and other regions of near stagnant gas.

The foregoing description is provided only as a possible explanation of the reasons for the advantageous results achieved by the present invention. In that regard, it should be noted that the combination of relatively low pressure, i.e. preferably on the order of 1 millimeter, and the elevated temperature, roughly on the order of 350° C. to 450° C., results in a low Reynolds number flow, probably including laminer, turbulent and even some free molecular flow, therefore resulting in a truly complex flow characteristic. However, the foregoing explanation should not be taken as a limiting explanation or as being exclusive of other possible modes of operation. In that regard, it is believed that any open structure providing sufficient surface area and/or defining sufficiently limited, though widely dispersed openings, would operate to regulate the flow therethrough to provide for a more uniform longitudinal distribution. Such structures might include structures fabricated with a large number of circular arc segments closely spaced together and held in relative disposition by a relatively small number of longitudinal members or even large numbers of longitudinal and arc-like members, though the cage structure disclosed herein is believed preferable because of its presenting continuous longitudinal surfaces to allow attached flow along the length of the reactor. Thus, while the presently preferred embodiment of the invention has been specifically disclosed and described herein and alternate forms thereof have also been disclosed, it will be understood by those skilled in the art that various changes in form and detail may be made therein without departing from the spirit and scope of the invention.

We claim:

1. A cage for fitting within a reactor and making the flow of gasses along the reactor and around semiconductor wafers positioned approximately coaxially with each other and the reactor more uniform comprising
   a plurality of longitudinal members approximately distributed in an arc for fitting within the reactor;
   joining means joining said longitudinal members; and
   support means coupled to at least one of said joining means and said longitudinal members for supporting said arc defined by said longitudinal members within the reactor so as to be approximately coaxial with semiconductor wafers in the reactor;
   said longitudinal members being distributed in an arc of less than 360° so as to leave a lower region open for free passage of boats supporting wafers.

2. The cage of claim 1 wherein said longitudinal members are distributed in an arc of approximately 270° so as to leave a lower region open for free passage of boats supporting the wafers.

3. The cage of claim 1 wherein the combined periphery of said longitudinal members is at least approximately equal to the length of said arc about which they are distributed.

4. The cage of claim 1 wherein said cage is a quartz cage.

5. A cage for making the flow of gasses within and along a reactor and around semiconductor wafers positioned approximately coaxially with each other and the reactor comprising:
   baffle means extending longitudinally within the reactor for partially encircling semiconductor wafers distributed along the longitudinal axis of the reactor, said baffle means being an open structure for allowing the flow of gas therethrough, and
   support means coupled to said baffle means for supporting said baffle means approximately concentric with said wafers.

6. The cage of claim 5 wherein said baffle means is defined in substantial part, longitudinally disposed surfaces.

7. The cage of claim 5 wherein said baffle means defines an arc of approximately 270° so as to leave a lower region open for free passage of boats supporting the wafers.

8. The cage of claim 7 wherein the surface area of said baffle means is at least approximately equal to the area of the circular arc defined thereby.

9. The cage of claim 5 wherein said cage is a quartz cage.

10. A cage for fitting within a cylindrical reactor and making the flow of gasses along the reactor and around semiconductor wafers positioned on a boat approximately coaxially therein more uniform comprising
    a plurality of longitudinal quartz members approximately distributed in an arc for fitting within the reactor;
    quartz joining means joining said longitudinal members; and
    quartz support means coupled to at least one of said joining means and said longitudinal members for supporting said arc defined by said longitudinal members within the reactor so as to be approximately coaxial with the reactor;
    said longitudinal members being distributed in an arc of approximately 270° so as to leave a lower region open for free passage of boats supporting wafers.

* * * * *